Figure 1:
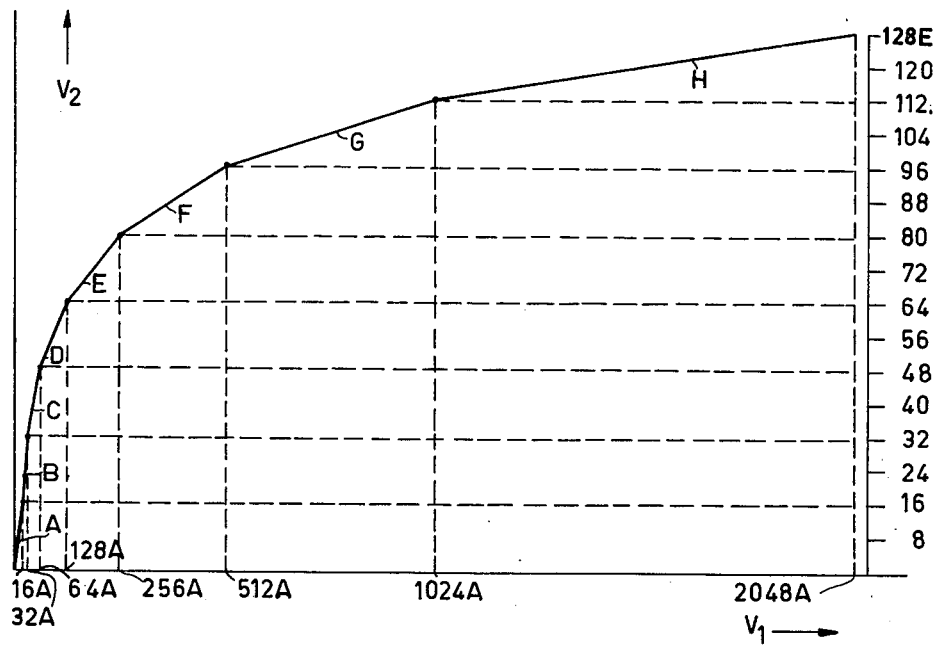

United States Patent [19]

Wouda

[11] 4,010,422
[45] Mar. 1, 1977

[54] TRANSMITTER FOR FORMING NON-LINEAR PULSE CODE MODULATED SAMPLES OF ANALOG SIGNALS BY TIMING THE INTEGRAL OF SIGNAL SAMPLES

[75] Inventor: Kornelis Jan Wouda, Hilversum, Netherlands

[73] Assignee: U.S. Philips Corporation, New York, N.Y.

[22] Filed: Oct. 25, 1973

[21] Appl. No.: 409,425

Related U.S. Application Data

[63] Continuation of Ser. No. 188,762, Oct. 13, 1971, abandoned.

[30] Foreign Application Priority Data

Oct. 15, 1970  Netherlands ............... 7015118

[52] U.S. Cl. .................... 325/141; 325/38 R
[51] Int. Cl.² ........................... H04B 1/04
[58] Field of Search ........... 325/38 R, 38 A, 38 B, 325/41, 141–143; 179/15 AC, 15 AV, 15 BW, 15.55 T

[56] References Cited
UNITED STATES PATENTS

| | | | |
|---|---|---|---|
| 3,708,624 | 1/1973 | Boxall | 179/15 AV X |
| 3,784,922 | 1/1974 | Blahut | 325/38 B X |
| 3,798,637 | 3/1974 | Fruhauf | 325/38 R X |
| 3,815,033 | 6/1974 | Tewksbury | 325/38 B X |
| 3,831,092 | 8/1974 | Greefkes | 325/42 X |

*Primary Examiner*—Benedict V. Safourek
*Assistant Examiner*—Aristotelis M. Psitos
*Attorney, Agent, or Firm*—Frank R. Trifari; Simon L. Cohen

[57] ABSTRACT

A non-linear pulse code modulator wherein input signals are coded into digital representations of amplitude range segments and amplitude in excess of the minimum amplitude within the respective range segment uses a first analog-to-digital converter having a sawtooth-shaped control characteristic to determine the amplitude range segment from an input signal sample. The output of the first analog-to-digital converter is used to effectively divide the signal sample by a factor $2^n$, where n corresponds to the determined range. The result of the division is then converted in a second analog-to-digital conversion to a digital signal that is combined with the digital range segment signal for transmission thereof.

7 Claims, 9 Drawing Figures

| | $V_1$ (A) | | $S_3$ | $S_2$ | $S_1$ | $V_3$(E) |
|---|---|---|---|---|---|---|
| A | 0 – 16 | $2^0$ | 0 | 0 | 0 | 0 – 16 |
| B | 16 – 32 | $2^0$ | 1 | 0 | 0 | 16 – 32 |
| C | 32 – 64 | $2^1$ | 0 | 1 | 0 | 16 – 32 |
| D | 64 – 128 | $2^2$ | 1 | 1 | 0 | 16 – 32 |
| E | 128 – 256 | $2^3$ | 0 | 0 | 1 | 16 – 32 |
| F | 256 – 512 | $2^4$ | 1 | 0 | 1 | 16 – 32 |
| G | 512 – 1024 | $2^5$ | 0 | 1 | 1 | 16 – 32 |
| H | 1024 – 2048 | $2^6$ | 1 | 1 | 1 | 16 – 32 |
Fig.3
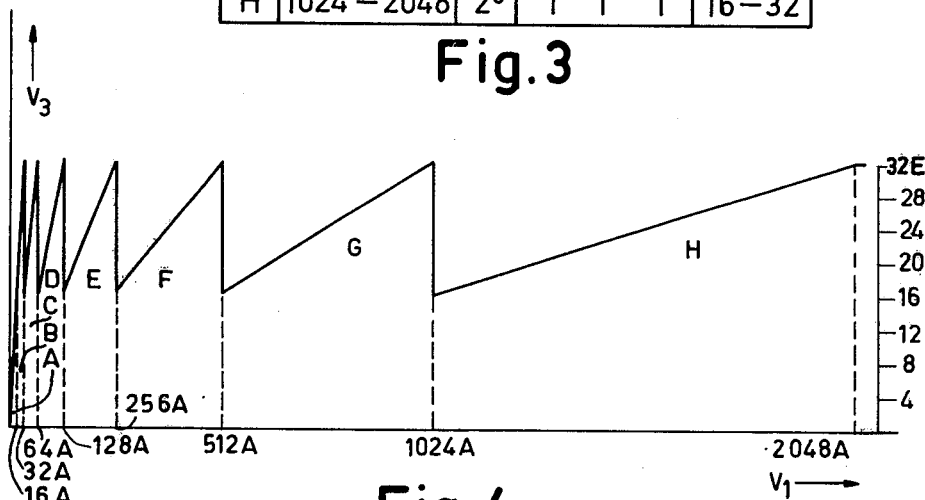
Fig.4
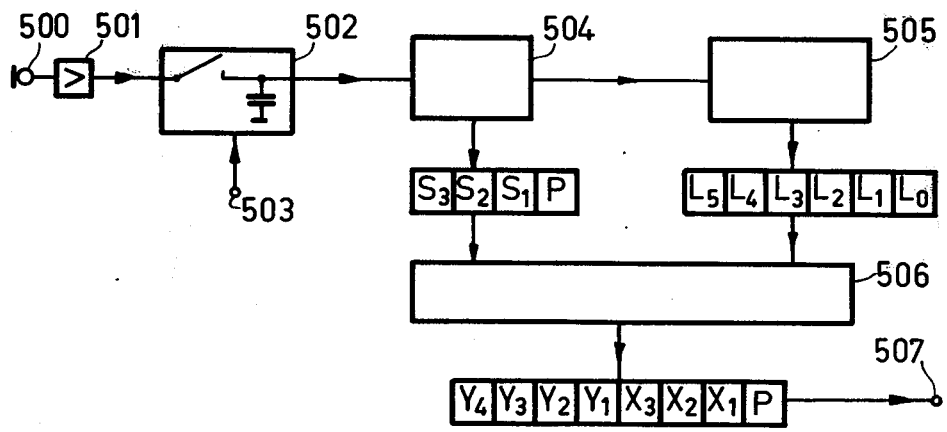
Fig.5
INVENTOR.
KORNELIS JAN WOUDA
BY
AGENT

TRANSMITTER FOR FORMING NON-LINEAR PULSE CODE MODULATED SAMPLES OF ANALOG SIGNALS BY TIMING THE INTEGRAL OF SIGNAL SAMPLES

This is a continuation of application Ser. No. 188,762, filed Oct. 13, 1971, now abandoned.

The invention relates to a transmitter for transmitting non-linear pulse code modulated samples of analog signals, in which the amplitude range of the analog signals is divided into segments, comprising a first analog-to-digital converter for converting the amplitude values of the samples of the analog signals into segment code words characterizing the segments containing the amplitude values, comprising an amplitude controller which is coupled to the first analog-to-digital converter and which has a sawtooth-shaped control characteristic, the samples of the analog signals being applied to the said controller, and comprising a second analog-to-digital converter to which the amplitude-controlled signal samples are applied for converting the controlled analog amplitude values into amplitude code words characterizing the controlled amplitude values.

A transmitter of this kind is known from German "Offenlegungsschrift" No. 1,900,368, issued Sept. 4, 1969. The amplitude controller therein described is formed by a number of amplifiers having different amplification factors, the inputs of said amplifiers being connected in parallel to the signal input for the signal samples, threshold units being connected to the outputs of said amplifiers. Of these amplifiers the amplifier whose output voltage is nearest below the threshold voltage is connected to the signal output of the amplitude controller. In this manner a sawtooth-shaped amplitude control characteristic is produced. An amplitude controller of this kind offering the accuracy required for faithfull coding of the analog signals can be realized in practice only with difficulty. To this end the amplifiers need not only be extremely stable, but the accurate adjustment of the relationship of their amplification factors also forms a problem.

The invention has for its object to provide a novel concept of the transmitter of the kind set forth by means of which the required coding accuracy can be realized by simple means.

The transmitter according to the invention is characterized in that the amplitude controller is formed by an integrator to which a signal having the amplitude value of the signal samples is applied, a threshold unit which is connected to the integrator, and a control member for terminating the charging process of the integrator at a number of fixed controltiming instants after the starting timing instant of each signal sample, said control member being in operation when the integrator voltage exceeds the threshold voltage of the threshold unit and at the last controltiming instant of the said number of controltiming instants.

This transmitter offers the advantage that in an embodiment comprising simple integrated semi-conductor circuits the high requirements as regards the coding accuracy can be met.

Figure 2:
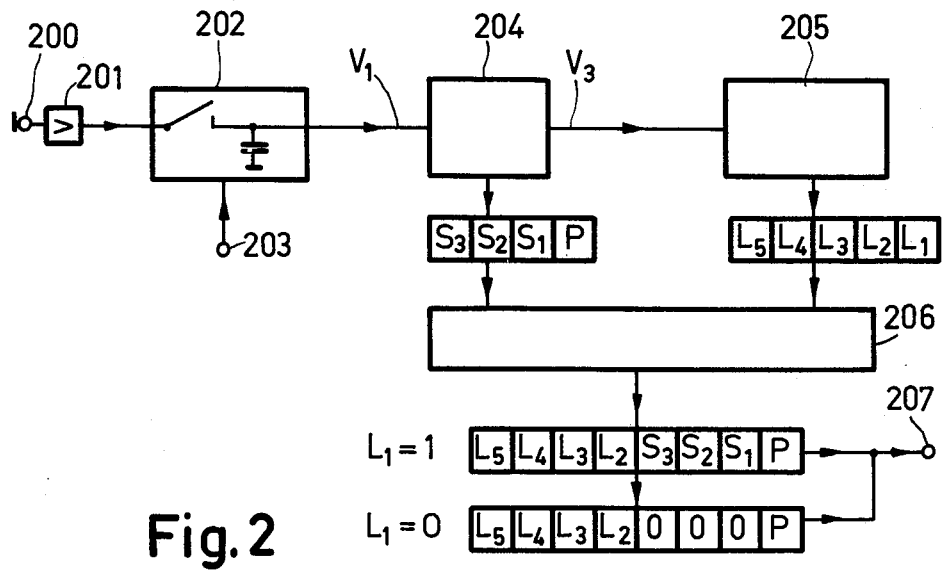
Figure 6:
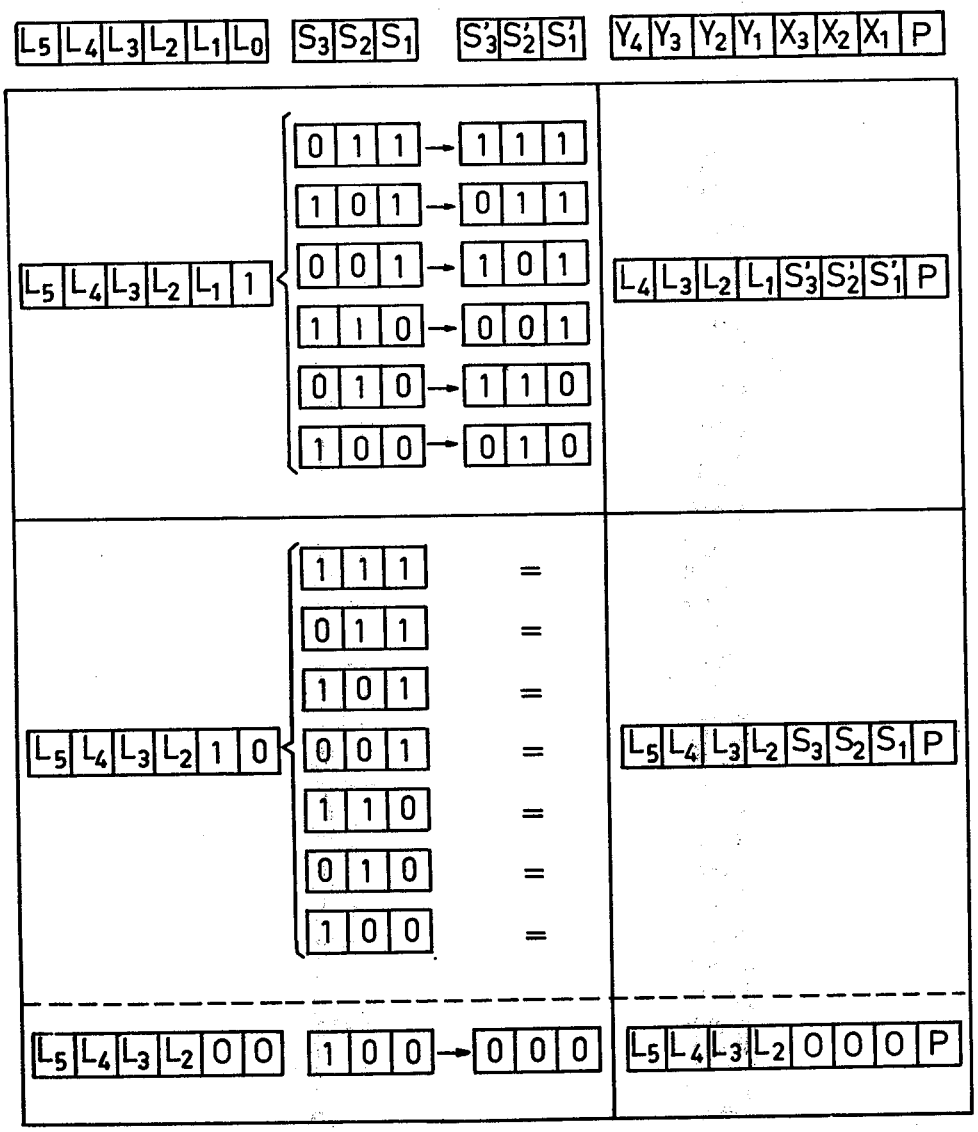
Figure 7:
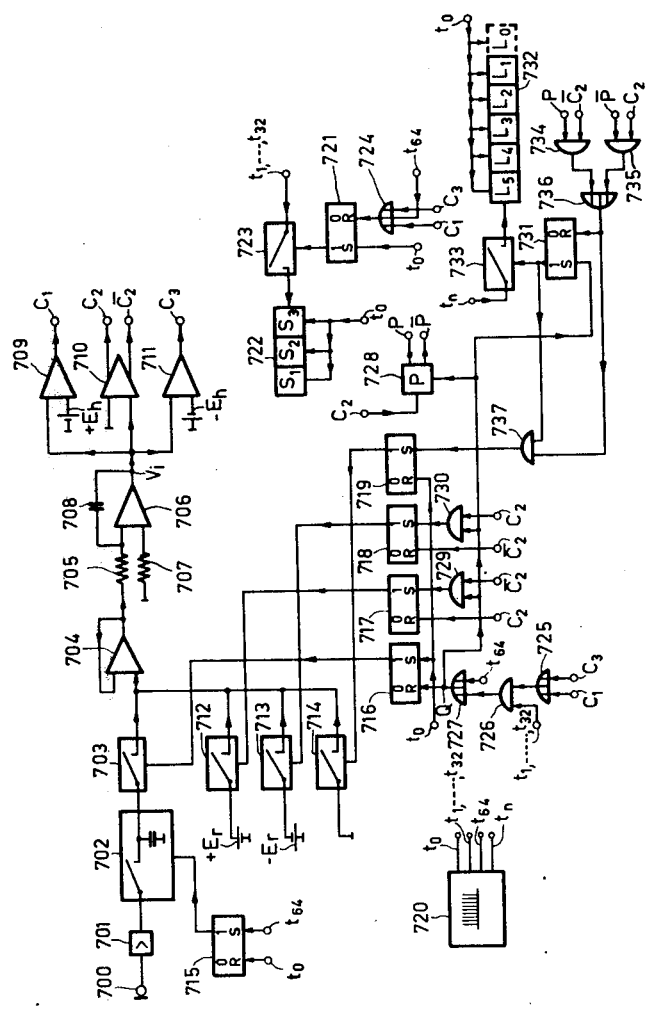
Figure 8:
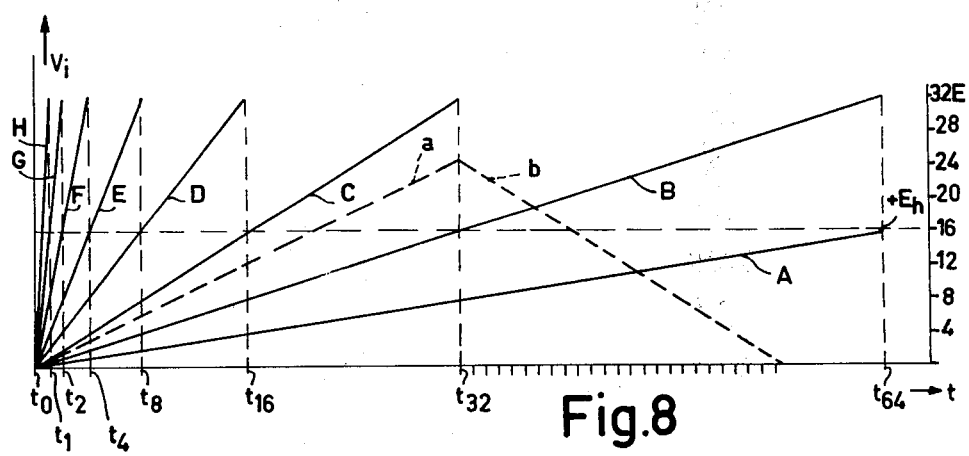
Figure 9:
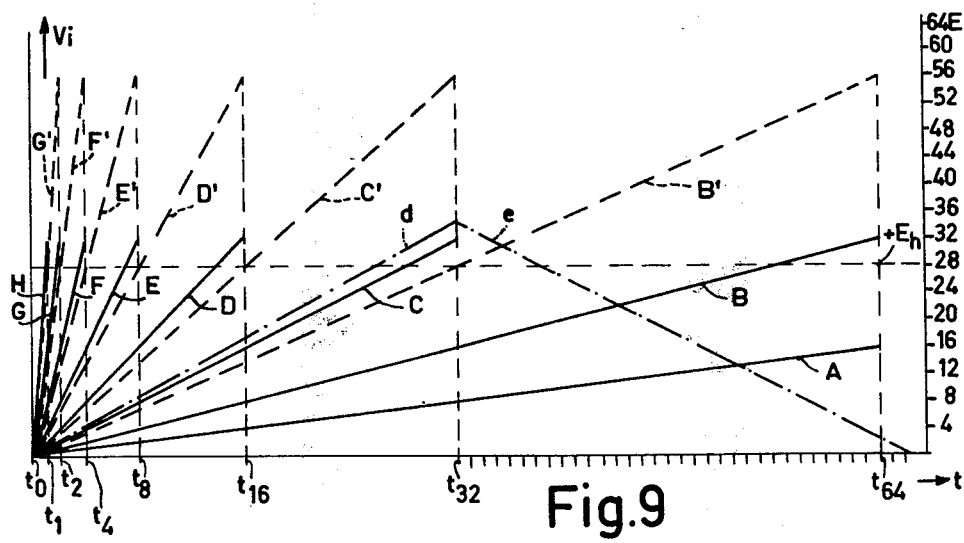

In order that the invention may be readily carried into effect, one embodiment thereof will now be described in detail, by way of example, with reference to the accompanying diagrammatic drawings, in which:

FIG. 1 shows a segmented compression characteristic,

FIG. 2 shows the block diagram of a pulse code modulator with modulation in two distinct phases, FIG. 3 shows a table illustrating the operation of the pulse code modulator shown in FIG. 2, FIG. 4 shows the amplitude control characteristic of the pulse code modulator shown in FIG. 2, FIG. 5 shows the block diagram of a pulse code modulator of the same type as shown in FIG. 2, making use of error correction, FIG. 6 shows a table illustrating the operation of the pulse code modulator shown in FIG. 5, FIG. 7 shows the diagram of an embodiment of the transmitter according to the invention, FIG. 8 shows a set of charging characteristics for illustrating the operation of the transmitter shown in FIG. 7, FIG. 9 shows a set of charging characteristics for illustrating the operation of the transmitter shown in FIG. 7, making use of error correction.

FIG. 1 shows a segmented compression characteristic which has been internationally proposed by CEPT (Conférence Européenne de Poste et Télécommunication). The positive analog amplitude values $V_1$ before compression are plotted to the right along the horizontal axis and the positive analog amplitude values $V_2$ after compression are plotted upwards along the vertical axis. The compression characteristic for the negative analog amplitude values is identical to the compression characteristic for the positive analog amplitude values. If the negative analog amplitude values before compression are plotted to the left on the horizontal axis and the negative analog amplitude values after compression are plotted downwards on the vertical axis, the compression characteristics for the positive and the negative analog amplitude values will be situated symmetrically with respect to the origin of the system of co-ordinates.

The compression characteristic for positive analog amplitude values consists of seven straight line segments, and the total compression characteristic for positive and negative analog amplitude values consists of thirteen straight segments. The latter is due to the fact that the straight line passing through the origin is counted as one segment. The lower straight line segment of the compression characteristic for the positive analog amplitude values and of the compression characteristic for the negative analog amplitude values is divided into two equal segments A and B. The other straight line segments will also be referred to as segments hereinafter. For the sake of simplicity it will be assumed hereinafter that the analog signal under consideration always has the same polarity. The compression characteristic consists of the eight segments, A, B, C, D, E, F and G. Each segment of the compression characteristic corresponds to a segment of the amplitude range along the horizontal axis and a segment of the amplitude range along the vertical axis. The amplitude range along the horizontal axis is divided into 2048 amplitude units A. The first two columns of the table of FIG. 3 show the relationship between the segments of the compression characteristic and the segments of the amplitude range along the horizontal axis, the latter being denoted by means of two extreme amplitude values expressed in amplitude units. The limit values between the latter segments relate as:

$2^0 : 2^1 : 2^2 : 2^3 : 2^4 : 2^5 : 2^6 : 2^7$.

In FIG. 1 a linear quantizing scale is plotted in the vertical direction at the right-hand side, said scale being divided into 128 quantizing units E. The segments of the compression characteristic correspond to equal segments of the quantizing scale. Each segment of the quantizing scale has a range of 16E. Upon quantizing of the analog signal, the quantized value on the quantizing scale which is nearest below the analog amplitude value is determined. The 128 quantized values of the quantizing scale are numbered according to the binary numerical system by means of 7 binary digits or bits from the binary number 0000000 for the lowest quantized value or zero level to 1111111 for highest quantized value (decimal : 127). In the case of pulse code modulation the quantized value of the analog amplitude value is transmitted as a binary number in the form of a pulse code. An additional bit, the polarity bit, is associated with this number so that the pulse code group transmitted for an analog amplitude value consists of 8 bits. By means of these 8 bits an amplitude range of two times 2048A of the analog signal can be covered.

Each segment of the quantizing scale has, as previously described, a range of 16E and there are 8 segments. If the binary number characterizing a quantized value is divided into two portions, one portion containing the three most significant bits and the other portion containing the four other bits, it may be stated that one portion characterizes the segments while the other portion determines the quantized value within the segment. The coding process, i.e. the determination of the binary number of 7 bits associated with an analog amplitude value, can in principle be performed in two phases. During the first phase the segment code is determined, i.e. the three bits determining the segment of the quantizing scale, while during the second phase the linear code is determined, i.e. the four bits determining the quantized value within the segment. In this context the term linear code is used to indicate that the second phase takes place within a linear portion of the compression characteristic. In the fourth column of FIG. 3 the segment code associated with the segments is given. $S_1$ in this column is the most significant bit.

FIG. 2 shows the block diagram of a pulse code modulator according to the above-mentioned principle. The source of analog signals is illustrated in FIG. 2 by a microphone 200, said microphone being connected via an amplifier 201 to a sampling and holding switch 202. Sampling pulses are applied at regular intervals to a control input 203 of switch 202. Under the control of each sampling pulse a sample is taken from the analog output signal of amplifier 201. The signal sample is applied to a unit illustrated by block 204. This unit comprises a first analog-to-digital converter for determining the segment code ($S_3$, $S_2$, $S_1$), a polarity detector for determining the polarity bit (P), and an amplitude controller. The amplitude controller has the sawtooth-shaped control characteristic shown in FIG. 4. The analog amplitude value $V_1$ on the input of the amplitude controller is plotted along the horizontal axis, while the analog amplitude value $V_3$ on the output of the amplitude controller is plotted along the vertical axis. This control characteristic is produced by relative attenuation of the analog amplitude values in the segments of the amplitude range along the horizontal axis, by the factor which is given in the third column of the table of FIG. 3. The amplitude controller and the first analog-to-digital converter are coupled to each other in a fixed manner, so that when an attenuation according to the third column of the table given in FIG. 3 is adjusted, the first analog-to-digital converter supplies the corresponding segment code according to the fourth column, and vice versa. A possible error of a factor 2 in the adjusted attenuation then causes in the segment code (considered as a binary number) an error in the unit. The controlled amplitude value $V_3$ is applied to a second analog-to-digital converter 205. The latter has a linear quantizing scale of 32 units. This quantizing scale is plotted in the vertical direction in FIG. 4 at the right-hand side. The controlled amplitude values $V_3$ of the segments B, C, D, E, F and G are all situated within the range 16E – 32E of this quantizing scale. Only the controlled amplitude values $V_3$ of the segment A are situated in the range 0 – 16E of the quantizing scale. The foregoing is shown in the last column of the table of FIG. 3. The quantized values of the quantizing scale of the second analog-to-digital converter are numbered according to the binary number system using 5 bits from 00000 for the lowest value or zero value to 11111 (decimal : 31) for the highest quantized value. These five bits are denoted by $L_5,L_4,L_3,L_2,L_1$, $L_1$ being the most significant bit. The four bits $L_5,L_4,L_3,L_2$ form the linear code of the signal sample. The most significant bit $L_1$ is used only for making a distinction between the segments A and B. The first analog-to-digital converter, forming part of the unit 204, FIG. 2, supplies the same segment code (100) for analog amplitude values which are situated in the segments A and B of the amplitude range. This is caused to the construction of this analog-to-digital converter as will be explained hereinafter. The amplitude controller operates with the same attenuation factor in these segments (see table of FIG. 3, third column), so that it is not necessary to make a distinction between the segments A and B in unit 204. This distinction is made in the second analog-to-digital converter 205. If it appears therein that $L_1=0$, the analog amplitude value is situated in segment A. If this is the case, the unit 204 supplies the segment code 100, which is to be converted into the segment code 000 characterizing segment A.

In FIG. 2 a logic unit 206 is illustrated The bits $S_3,S_2,S_1$, P of unit 204 and the bits $L_5,L_4,L_3,L_2,L_1$ of the second analog-to-digital converter 205 are applied to this logic unit. The logic unit combines these two bit groups to form one code word of 8 bits, as is indicated below the symbol for unit 206 in FIG. 2 for the two cases $L_1=1$ and $L_1=0$. The code word formed by the logic unit 206 is transmitted serially via output termial 207 under the control of clock pulses, the code word thus obtaining the form of a pulse code group.

A control characteristic as shown in FIG. 4 can be realized in a known manner by using a number of amplifiers whose inputs are connected in parallel, the amplification factors of said amplifiers relating as $2^6:2^5:2^4:2^3:2^2:2^1:2^0$. If a threshold unit having a threshold value of 32E is connected to each of the oututs, the segment of the analog amplitude value is determined by the amplifier whose output voltage is situated nearest below the threshold voltage. The output voltage of the amplitude controller is derived from the amplifier thus determined. it is to be noted that the amplifier having the comparatively lowest amplification corresponds to segment H. This is in agreement with the third column of the table of FIG. 3. The amplifier having the comparatively lowest amplification provides the comparatively largest attenuation. In view of reliable signal transmission, severe requirements are imposed on a pulse code modulator as regards coding accuracy. The coding accuracy is dependent inter alia on the accuracy of the amplitude controller. When parallel-connected amplifiers are used, it is a problem to keep the amplification of each of the amplifiers stable within narrow limits and to adjust the ratio of their amplification factors within narrow limits. Such an accuracy is difficult to realize in integrated semiconductor circuits.

So as to meet the high requirements as regards the coding accuracy while using simple integrated semiconductor circuits, the amplitude controller according to the invention is formed by an integrator to which a signal having the amplitude value of the signal samples is applied, and a threshold unit which is connected to the integrator. Also provided is a control member for terminating the charging process of the integrator at a number of fixed control timing instants after the starting instant of each signal sample. The control member is in operation when the integrator voltage exceeds the threshold voltage of the threshold unit, and at the least controltiming instant. In the special case of the compression characteristic shown in FIG. 1 and a linear integrator, the time intervals defined by the controlling instants commencing from the starting instant of a signal sample will relate as $2^0:2^1:2^2:2^3:2^4:2^5:2^6$. The highest relative amplification (or the lowest relative attenuation) is obtained at the last control timing instant, corresponding to the segments A and B of the range of the analog amplitude values.

According to a second aspect of the invention the first analog-to-digital converter is formed by a counter for counting the number of control timing instants between the starting timing instants of each signal sample and the timing instant at which the charging process is terminated. If this counter is of the binary type, the complement value of the counting position gives the segment code. Instead of forming the complement after counting, a counter may also be used which counts in the other direction, i.e. starting from the highest counting position. The accuracy of this amplitude controller is determined by the linearity of the integrator, the accuracy of the control timing instants and the accuracy with which the exceeding of the threshold voltage is detected. The control timing instants are derived from a clock which can be readily realized with the desired frequency accuracy, for example, by using a crystal oscillator. An accurate linear integrator can also be readily realized.

The accuracy of the threshold unit is important mainly as regards those values of the amplitude of the analog signal at which the integrator voltage is close to the threshold voltage at a control timing instant. This threshold voltage will normally be chosen to be equal to half the maximum integrator voltage, i.e. equal to 16 coding units of the second analog-to-digital converter. These are the amplitude values which correspond to the breaking points in the compression characteristic where at a control timing instant the integrator voltage is exactly equal to the threshold voltage. The uncertainty in the decision of the threshold unit for voltages which are close to the threshold voltage then gives rise to an unsystematic error in the segment coding in either other direction. By shifting the threshold voltage, it can be ensured that the error always acts in one direction, it being readily possible to correct the latter error in the second analog-to-digital converter. This correction method is described in the applicant's previously filed patent Ser. application No. 120,542, filed Mar. 3, 1971, and will be described in brief with reference to the FIGS. 5 and 6.

FIG. 5 shows a pulse code modulator of the same type as shown in FIG. 2. It is assumed that, if the amplitude controller of unit 504 makes an error, the adjusted attenuation is a factor 2 too low. The segment code and the attenuation adjusted by the amplitude controller are in a fixed relation to each other. When the relative attenuation is a factor 2 too low, the segment code (as a binary number) will be one too low as appears from a comparison of the third and the fourth column of the table shown in FIG. 3.

The coding range of the second analog-to-digital converter 505 is increased by a factor 2 to 64E with respect to FIG. 2. The quantized values are coded by 6 bits. The additional coding bit is denoted by $L_0$. If the amplitude controller does not make an error, the controlled amplitude value $V_3$ will always be within the range 0–32E as is indicated in the last column of the table of FIG. 3. In this case $L_1=0$ and the segment code is correct. As is the case in the pulse code modulator shown in FIG. 2, the segment code 100 is converted into 000 only if $L_2=0$. The amplitude controller cannot make an error for analog amplitude values in the segments A and B as the relative attenuation is equal to the minimum attenuation. If the amplitude controller makes an error, the controlled amplitude value will be in the range 32–64E and $L_0=1$. In that case the segment code is to be increased by the unit. Acoordingly, the code of the second analog-to-digital converter is to be divided by 2, the result being rounded of downwards so as to find the correct linear code. The linear code is then formed by: $L_4,L_3,L_2.L_1$.

The logic operations described above are performed by the logic unit 506. The operation of logic unit 506 is illustrated in FIG. 6. The left-hand portion of the figure relates to the code of the second analog-to-digital converter. Three cases can be distinguished: $L_0=1$; $L_0=0$ and $L_1=1$; $L_0=0$. For each of these cases the possible segment code words ($S_3,S_2,S_1$) are given in the center portion, and so are the modified segment code words ($S_3',S_2',S_1'$) which are formed by the logic unit 506. The sign = indicates that no modification occurs. In the right-hand portion is given the output code combination which is formed by the logic unit for transmission via the output 507. The logic operations of logic unit 506 are fully specificed by FIG. 6 and are of an elementary nature. All those skilled in the art will be capable of realizing these operations using elementary means.

The uncertainty range at either side of the (nominal) threshold voltage, where it is uncertain which decision will be made by the threshold unit of the amplitude controller, may be larger than one coding unit when the correction method is used. For example, if the threshold voltage is fixed at 24E, a symmetrical uncertainty range having a width of less than 16E will be permissible. The uncertainty range is not only governed by the threshold unit itself, but also by the other components of the amplitude controller, and in particular also by the reference voltages used in conjunction therewith. The properties of all components will show a given spread, thus making a contribution to the uncertainty range. If a large uncertainty range is permissible, components having a comparatively larger spread in their properties can be used in the amplitude controller.

One embodiment of a pulse code modulator according to the invention will now be described with reference to FIG. 7. In FIG. 7 the analog signals are applied from a microphone 700, via an amplifier 701, to a sample-and-hold switch 702. The output of switch 702 is connected, via a switch 703, to an input of a differential amplifier 704 which is connected as a voltage-follower and which will be referred to hereinafter as voltage follower. The output thereof is connected, via a resistor 705, to one input of a differential amplifier 706 which is connected as a Miller integrator. The second input of this amplifier is connected, via a resistor 707, to a reference potential of 0 volts (earth). The integrating capacitor is denoted by 708. The components 705, 706, 707 and 708 are together referred to as the integrator. The rest level of the output of the integrator is 0 volts. Hereinafter, charging is to be understood to mean increasing the charge in the positive or negative sense with respect to the rest level, and discharging will be understood to means the decreasing of the charge in the direction of the rest level.

Three differential amplifiers 709, 710 and 711, each connected as a threshold unit, are connected to the output of the integrator, said amplifiers being referred to hereinafter as threshold units. The threshold voltages are $+E_h$ volts, 0 volts and $-E_h$ volts, respectively. The output signals of the threshold units have two possible levels which are denoted by "1" and "0". The outputs of the threshold units are denoted by $C_1$, $C_2$ and $C_3$. The output $C_1$ has the logical signal level "1" when the integrator voltage is higher than $+E_h$. This is expressed by the equality $C_1=1$. When the integrator voltage is lower than $+E_h$, the output has the logical signal level "0". This is expressed by $C_1=0$. Similarly, $C_2=1$ when the integrator voltage is positive, $C_2=0$ when the integrator voltage is negative, $C_3=1$ when the integrator voltage is lower (more negative) than $-E_h$, and $C_3=0$ when the integrator voltage is higher than $-E_h$. Threshold unit 710 has an inverted output $\overline{C_2}$, the output signal of which is the inverse of the output signal of output $C_2$.

For the linear coding of the controlled analog amplitude values, the pulse code modulator has three reference voltage sources of $+E_r$ volts, $-E_r$ volts and 0 volts. Connected between these reference sources and the input of voltage follower 704 are the switches 712, 713 and 714. The sampling sample-and-hold switch 702 and the switches 703, 712, 713 and 714 are controlled from the 1-outputs of the flipflops 715, 716, 717, 718 and 719. A switch allows a signal to pass if the relevant flipflop is in the 1-state, and blocks the signal in the other state of the flipflop.

The timing of the switching operations in the pulse code modulator is controlled by a clock 720. This clock has an output $t_0$ on which a clock pulse $t_0$ appears which has the desired sampling frequency, for example, 8000 Hz. On a second output $t_1,-t_{32}$ a sequence of clock pulses $t_1,t_2,t_4,t_8,t_{16},t_{32}$ appears after each pulse $t_0$, the time distances of said clock pulses with respect to the clock pulse $t_0$ relating as $2^0:2^1:2^2:2^3:2^4:2^5$. Consequently, each clock pulse of this sequence appears twice as late as the preceding clock pulse. On a third output $t_{64}$ a clock pulse is supplied which appears twice as late as the clock pulse $t_{32}$. On a fourth output $t_n$ a sequence of clock pulses appears at a mutual distance which is equal to the time unit.

Just before the timing instant $t_0$ flipflop 719 is in the 1-state and the flipflops 716, 717 and 718 are in the 0-state. The flipflop 715 is set to the 1-state at the instant $t_{64}$ so that a sample is taken of the output signal of amplifier 701. At the instant $t_0$ flipflop 715 is reset to the 0-state. From this instant until the instant $t_{64}$ switch 702 supplies an output signal having the amplitude value of the signal sample. During the time that flipflop 719 is in the 1-state, the output of the integrator is kept at 0 volts by the 0-volts reference voltage via switch 714, so that no charge is present just before the start of a coding operation.

At the instant $t_0$ flipflop 719 is reset to the 0-state, and flipflop 716 is set to the 1-state. As a result, switch 703 is closed and a signal having the amplitude value of the signal sample is applied to the integrator via voltage-follower 704. The voltage of the integrator will increase linearly with time; the rate of increase being proportional to the analog amplitude value of the signal sample.

At the instant $t_0$ the flipflop 721 is also set to the 1-state. This flipflop forms part of the first analog-to-digital converter for determining the segment code. The first analog-to-digital converter furthermore comprises a binary counter 722 and a switch 723 to which the clock pulses $t_1,t_2,-,t_{32}$ are applied. Flipflop 721 in the 1-state closes switch 723, so that the clock pulses $t_1,t_2,-,t_{32}$ are applied to the binary counter 722. At the instant $t_0$ the binary counter 722 is set to the state $S_3,S_2,S_1=111$, and each pulse applied to the counter lowers the state code by the unit. In this manner the counter 722 passes through the states $S_3,S_2,S_1=111$, 011,101,-,100. At the instant that, during charging of the integrator, the integrator voltage becomes higher than $+E_h$ ($C_1=1$) or lower than $-E_h$($C_3=1$), the flipflop 721 is reset to the 0-state via OR-gate 724. If $C_1=1$ or $C_3=1$ does not occur before the instant $t_{64}$, the flipflop 721 is reset to the 0-state by the clock pulse $t_{64}$ via OR-gate 724.

If $C_1=1$ or $C_3=1$, the AND-gate 726 is actuated via OR-gate 725. The output of this AND-gate is connected to the reset input of flipflop 716 via the OR-gate 727. The clock pulses $t_1,t_2,-,t_{32}$ are applied to AND-gate 726, so that the flipflop 716 is reset to the 0-state by the first clock pulse of the sequence $t_1,t_2,-,t_{32}$ which occurs after the occurrence of the state $C_1=1$ or $C_3=1$. If the state $C_1=1$ or $C_3=1$ does not occur before the instant $t_{64}$, the flipflop 716 is reset to the 0-state by the clock pulse $t_{64}$ via OR-gate 727. The reset signal appearing on the reset input of flipflop 716 is referred to as Q for further reference; $t(Q=1)$ denoting that instant from the series of instants $t_1,t_2,-,t_{32},t_{64}$ at which flipflop 716 is reset to the 0-state. The instant $t(Q=1)$ marks the end of the charging process of the integrator as at that instant switch 703 is opened.

Reference is now made to FIG. 8 which shows a set of charging characteristics of the integrator. For each analog amplitude value in the range 0–2048 A (FIG. 1), a corresponding charging characteristic can be plotted. The solid lines in FIG. 8 are the charging characteristics of the analog amplitude values corresponding to the break-points between the various segments. The charging characteristics for the amplitude values associated with segment A are all situated below the charging characteristic denoted by A. The charging characteristics of the amplitude values associated with element B are situated between the charging characteristic denoted by B and the charging characteristic denoted by A, and so on. A broken line (as far as the instant $t_{32}$) illustrates the charging characteristic $a$ associated with the analog amplitude value 49A of segment C.

The quantizing scale of the second analog-to-digital converter is plotted in the vertical direction, in FIG. 8 at the right-hand side. For the moment it will be assumed that the correction method is not used. The threshold voltage $+E_h$ is the equal to 16E. So as to illustrate the determination of the segment code it is assumed that the signal sample has the analog amplitude value 49A. The integrator voltage $V_i$ follows the charging characteristic $a$. The charging characteristic intersects the line $V_1=+E_h$ between the instants $t_{16}$ and $t_{32}$ so that $t(Q=1)=t_{32}$, i.e. the charging process of the integrator is terminated at instant $t_{32}$. At any of the instants $t_2,t_4,-,t_{64}$ the integrator voltage has increased by a factor 2 with respect to the previous instant, i.e. the relative amplification at the instants $t_1,t_2,-,t_{64}$ amounts to $2^0,2^1,-,2^6$. At the instant $t_{32}$ the relative amplification amounts to $2^5$, which corresponds to a relative attenuation of $2^1$. (Compare the table of FIG. 3 for segment C.) The controlled amplitude value at the instant $t_{32}$ is $49E/2^1$, which is in agreement with the amplitude control characteristic shown in FIG. 4.

From the intersection of charging characteristic $a$ and the line $V_i=+E_h$, the state of $C_1=1$ occurs so that the flipflop 721 is reset to the 0-state via OR-gate 724 and the switch 723 is opened. In this case the sequence of clock pulses $t_1,t_2,-,t_{16}$ has been applied to the counter 722 so that the latter is set, starting from the state $S_3,S_2,S_1=111$, to the state 010 ($t_{16}$), via the intermediate states 011 ($t_1$), 101 ($t_2$), 001 ($t_4$), 110 ($t_8$). The state 010 corresponds to the code word of segment C as appears from the table of FIG. 3.

In the case that the amplitude value is associated with segment B as well as in the case that the amplitude value is associated with segment A, the counter 722 will receive the complete sequence of clock pulses $t_1,t_2,-,t_{32}$. In both cases these clock pulses set the counter to the state 100. In these cases the logic unit 206 shown in FIG. 2 provides transmission of the correct segment code in the previously described manner.

The signal Q is applied to the binary storage element 728 so as to control the storage therein of the polarity bit determined at the instant $t(Q=1)$ by the signal of output $C_2$ of threshold unit 710. The storage element 728 has 2 inverted outputs P and $\overline{P}$. P=1 denotes that the polarity is positive and P=0 denotes that the polarity is negative. The signal Q is also applied to the AND-gates 729 and 730, the outputs of which are connected to the set inputs of the flipflops 717 and 718. If $C_2=1$, the AND-gate 729 is actuated, and if $C_2=1$ the AND-gate 730 is actuated so that at the instant $t(Q=1)$ the flip-flop 717 is set to the 1-state if $C_2=1$, and the flip-flop 718 is set to the 1-state if $C_2=1$. In this way the switch 712 is closed at the instant $t(Q=1)$ if the integrator voltage is negative, and the switch 713 is closed if the integrator voltage is positive. The integrator is subsequently linearly discharge by a constant current (positive or negative) to the rest level and functions as a pulse duration modulator for the second analog-to-digital converter operating according to the counting principle.

At the instant $t(Q=1)$ the flipflop 731 is set to the 1-state. This flipflop forms part of the second analog-to-digital converter for determining the linear code of the controlled amplitude value. The second analog-to-digital converter furthermore comprises a binary counter 732 and a switch 733 to which the clock pulses $t_n$ are applied. Flipflop 731 in the 1-state closes the switch 733, so that the clock pulses $t_n$ are applied to the counter 732. At the instant $t_0$ the counter 732 is set to the state $L_5,L_4,L_3,L_2,L_1=00000$. (The stage $L_0$ shown in broken lines is to be neglected for the time being.) Each clock pulse $t_n$ which is allowed to pass by switch 733 increases the state code by the unit. So as to illustrate the determination of the linear code, the case where the analog amplitude value amounts to 49A is chosen by way of example. The integrator then follows the discharging characteristic $b$ represented in FIG. 8 by a broken line. This discharging characteristic intersects the line $V_i=0$ after the switch 733 has allowed 24 clock pulses $t_n$ to pass and the binary counter 732 has been set to the state $L_5,L_4,L_3,L_2,L_1=00011$. After this instant, denoted by $t(V_i=0)$, $\overline{C_2}=1$ if P=1, or $C_2=1$ if P=0 ($\overline{P}=1$). If P=1 and $\overline{C_2}=1$, the flipflop 731 is reset to the 0-state via AND-gate 732 and OR-gate 736. In the case that $\overline{P}=1$ and $C_2=1$, flipflop 731 is reset to the 0-state via AND-gate 735 and OR-gate 736. In this way the switch 733 is opened directly after the discharging characteristic intersects the line $V_i=0$. In the case under consideration the binary counter reaches the state $L_5,L_4,L_3,L_2,L_1=00011$. This code word is combined with the code word of the first analog-to-digital converter by the logic unit 206 shown in FIG. 2 in the manner indicated in this figure.

If $\overline{C_2}=1$ at the instant $t(Q=1)$, flipflop 717 is set to the 1-state. $C_2=1$ directly after the instant $t(V_i=0)$. As a result, flipflop 717 is reset to the 0-state. If $C_2=1$ at the instant $t(Q=1)$, flipflop 718 is set to the 1-state. $\overline{C_2}=1$ directly after the instant $t(V_i=0)$. As a result, flipflop 718 is reset to the 0-state. Flipflop 731 in the 1-state activates the AND-gate 737. The reset signal of flipflop 731 is applied to AND-gate 737. The output of AND-gate 737 is connected to the set input of flipflop 719, so that the latter is set to the 1-state at the same instant that switch 733 is opened. Flipflop 719 closes switch 714 so that the integrator voltage is kept at 0 volts until the next instant $t_0$.

When the correction method is used, the stage $L_0$ is added to the binary counter 732. Furthermore, the time unit is reduced by a factor 2. The threshold voltage $E_h$ is fixed between 16E and 32E. Reference is made to FIG. 9 which shows a set of solid charging characteristics and a set of broken charging characteristics. The solid charging characteristics correspond to the correspondingly denoted characteristics shown in FIG. 8. The broken charging characteristics correspond to the analog amplitude values for which the integrator voltage is equal to 28E at an instant of the sequence $t_1,t_2,-,t_{32}$. The quantizing scale of the second analog-to-digital converter is plotted in FIG. 9 at the right-hand side in the vertical direction. It is assumed that the value of 28E corresponds to the upper value of the uncertainty range extending on both sides of the threshold voltage. Consequently, the threshold voltage will be slightly below 28E. For the purpose of illustration it is assumed that the uncertainty range has a width of 4E and is symmetrical with respect to 26E. If at one of the clock instants $t_1,t_2,-,t_{32}$ the integrator voltage is higher than 28E, the charging process will certainly be terminated at that clock instant. If the integrator voltage is lower than 28E and higher than 24E, it is possible that the charging process is terminated at the relevant clock instant, but it is also possible that the charging process is terminated at the next clock instant. If the integrator voltage is lower than 24E, the charging process will certainly be terminated at the next clock instant.

The analog amplitude value whose charging characteristics are situated between the characteristics B' and B and reach beyond the instant $t_{32}$, are coded in segment B by the binary counter 722, even though they are associated with segment C. In general, the analog amplitude values whose charging characteristics are situated between a broken charging characteristic and the solid charging characteristic situated therebelow, and reach beyond the clock instant at which the solid characteristic terminates, will be coded one segment too low. To all these amplitude values it applies that at the instant at which the charging process is terminated, the integrator voltage is higher than 32E, so that upon linear coding $L_0=1$. The segment code and the linear code are in this case corrected in the manner as described with reference to the FIGS. 5 and 6.

For the purpose of illustration the case will be considered where the signal sample has the amplitude value 69A, i.e. an amplitude value of segment D. The integrator then follows the charging characteristic $d$ shown in FIG. 9. After the instant $t_8$ and before the instant $t_{16}$, the code word 110 is set in the binary counter 722, i.e. the code word of segment D. At the instant $t_{16}$ the integrator voltage is below the lower value (24E) of the uncertainty range, so that the charging process will certainly be terminated only at the instant $t_{32}$. The binary counter 722 is set in the state 010 after the instant $t_{16}$, i.e. the code word of segment C. At the instant $t_{32}$ the integrator voltage has the value of 69 E/$2^1$. As of the instant $t_{32}$ the integrator voltage follows the discharging characteristic $e$ which intersects the line $V_i=0$ after 34 clock pulses $t_n$. At the instant $t(V_i=0)$ the binary counter 732 is in the state $L_5,L_4,L_3,L_2,L_1,L_0=010001$. The logic unit 506 shown in FIG. 5 forms the code word $L_4,L_3,L_2,L_1,S_3',S_2',S_1'=1000110$ from the code words of the counters 722 and 732, as appears from FIG. 6. This code word would have also been formed if the charging process would have terminated at the instant $t_{16}$ instead of at the instant $t_{32}$.

A significant advantage of the application of the same integrator in the segment coding and in the linear coding is that the coding accuracy is independent of the RC-time of the integrator. The voltage of the integrator at the instant $t(Q=1)$ at which the charging process is terminated, is proportional to the amplitude value of the analog signal and inversely proportional to the RC-time. The discharging time of the integrator, i.e. the time expiring between the instant $t(Q=1)$ and the instant $t(V_i=0)$, is proportional to both the voltage of the integrator at the instant $t(Q=1)$ and to the RC-time, so that the RC-time has been eliminated as a decisive factor in the discharging time.

The foregoing can be expressed in formulas as follows:

$$U = V/RC \cdot (t(Q=1)-t_0) \quad (1)$$

$$t(V_i=0)-t(Q=1) = U/E_r \cdot RC \quad (2)$$

, in which U is the voltage of the integrator and V is the amplitude value of the signal sample.

From the formulas (1) and (2) it follows that:

$$t(V_i=0)-t(Q=1) = V/E_r \cdot (t(Q=1)-t_0) \quad (3)$$

The discharging time which is stated in the left-hand member of equation (3) is the value which is coded by the second analog-to-digital converter by counting clock pulses. As the RC-time of the integrator is not present in the right-hand member of equation (3), the effect thereof on the coding accuracy is eliminated. The inaccuracy in the determination of the RC-time makes a contribution to the uncertainty range occurring in the segment coding. By using the correction method, the effect of the uncertainty range on the coding accuracy, however, can be completely eliminated.

It is not necessary to use a linear integrator for the segment coding. In principle, a non-linear integrator can also be applied. By a non-linear integrator is to be understood an integrator having a non-linear charging characteristic. As an example of a non-linear characteristic is considered an exponential characteristic of the shape $2^t$. The sequence of clock instants which is formed by the sequence $t_1,t_2,-,t_{64}$ when a linear characteristic is used, is replaced by the sequence $t_1,t_2,t_3,t_4,t_5,t_6,t_7$ when the exponential characteristic is used. It applies, like in the case of the linear characteristic, that at any clock instant the integrator voltage is twice as high as at the preceding instant.

What is claimed is:

1. A transmitter for forming non-linear pulse code modulated signals from analog signals, in which the amplitude range of the analog signals is divided into segments, comprising means for forming signal samples of said analog signals, a first analog-to-digital converter for converting the amplitude values of the samples of the analog signals into segment code words specifying the segments containing the amplitude values; an amplitude controller coupled to the first analog-to-digital converter and to the samples of the analog signals and having a sawtooth-shaped control characteristic, the amplitude controller comprising an integrator to which each analog signal sample is applied, a threshold unit connected to the integrator, and a control member for terminating the integration at a number of fixed timing control instants after the starting timing instant of each signal sample, said control member being in operation when the integrator voltage exceeds the threshold voltage of the threshold unit and at the last control timing instant of the said number of control timing instants; and a second analog-to-digital converter to which the amplitude-controlled signal samples from the integrator are applied for converting the controlled analog amplitude values from the integrator into amplitude code words specifying the controlled amplitude values.

2. A transmitter as claimed in claim 1, wherein the integrator has a linear charging characteristic.

3. A transmitter as claimed in claim 1, wherein the integrator has an exponential charging characteristic.

4. A transmitter as claimed in claim 2, where the limit values of the segments relate as $a_0:a_1:a_2:-:a_n$, the time intervals between the said number of control timing instants and the starting timing instant of each signal sample being related as $a_0:a_1:a_2:-:a_n$.

5. A transmitter as claimed in claim 1, wherein the first analog-to-digital converter comprises a counter for counting the number of control timing instants between the starting timing instant of each signal sample and the timing instant at which the charging process of the integrator is terminated.

6. A transmitter as claimed in claim 1, wherein the second analog-to-digatal converter is a counter coding unit, comprising a pulse duration modulator for converting the controlled analog amplitude values into pulse durations and a pulse generator for converting the pulse durations into numbers of pulses.

7. A transmitter as claimed in claim 6, wherein the pulse duration modulator is formed by the integrator and a discharging unit connected to the integrator.

* * * * *

UNITED STATES PATENT AND TRADEMARK OFFICE
CERTIFICATE OF CORRECTION

PATENT NO. : 4,010,422
DATED : March 1, 1977
INVENTOR(S) : KORNELIS JAN WOUDA

It is certified that error appears in the above-identified patent and that said Letters Patent are hereby corrected as shown below:

Col. 5, line 21, "least" should be --last--;

line 22, "controltiming" should be --control timing--;

line 24, "controlling" should be --control timing--;

line 64, cancel "other";

Col. 6, line 40, "$L_0 = 0$" should be --$L_0 = 0$ and $L_1 = 0$--;

Col. 9, line 5, "the" should be --then--;

line 49, "$C_2 = 1$" (first occurence) should be --$\overline{C}_2 = 1$-- line 51, "$C_2 = 1$" should be --$\overline{C}_2 = 1$--;

Col. 11, line 56, equation (1) should read --$U = \frac{V}{RC} \cdot (t(Q=1) - t_0)$-- line 58, equation (2) should read

--$t(V_i=0) - t(Q=1) = \frac{U}{E_r} \cdot RC$--;

UNITED STATES PATENT AND TRADEMARK OFFICE
CERTIFICATE OF CORRECTION

PATENT NO. : 4,010,422
DATED : March 1, 1977
INVENTOR(S) : KORNELIS JAN WOUDA

It is certified that error appears in the above-identified patent and that said Letters Patent are hereby corrected as shown below:

Col. 11, line 63, equation (3) should read $$\text{--} t(V_i=0) - t(Q=1) = \frac{V}{E_r} \cdot (t(Q=1) - t_o) \text{--};$$

Signed and Sealed this nineteenth Day of July 1977

[SEAL]

Attest:

RUTH C. MASON
*Attesting Officer*

C. MARSHALL DANN
*Commissioner of Patents and Trademarks*